United States Patent [19]
Mitsui et al.

[11] Patent Number: 5,736,267
[45] Date of Patent: Apr. 7, 1998

[54] TRANSPARENT CONDUCTIVE FILM AND METHOD FOR ITS PRODUCTION, AND SPUTTERING TARGET

[75] Inventors: Akira Mitsui; Kazuo Sato; Masami Miyazaki; Junichi Ebisawa; Yasuo Hayashi; Masao Higeta, all of Yokohama; Katsuaki Aikawa, Kanagawa; Atsushi Hayashi, Yokohama, all of Japan

[73] Assignee: Asahi Glass Company Ltd., Tokyo, Japan

[21] Appl. No.: 515,805

[22] Filed: Aug. 16, 1995

[30] Foreign Application Priority Data

Aug. 17, 1994 [JP] Japan ..................... 6-193421

[51] Int. Cl.⁶ ..................................... B32B 9/00

[52] U.S. Cl. .................. 428/702; 428/699; 428/700; 428/701; 428/910; 252/629; 427/100; 310/313 R; 310/313 A; 310/360

[58] Field of Search ................... 428/699, 700, 428/701, 702, 910; 252/62.9; 427/100; 310/313 R, 313 A, 360

[56] References Cited

U.S. PATENT DOCUMENTS

| | | | |
|---|---|---|---|
| 4,142,124 | 2/1979 | Ogawa | 310/360 |
| 4,336,120 | 6/1982 | Sakakura | 204/192 SP |

*Primary Examiner*—Charles Nold
*Attorney, Agent, or Firm*—Oblon, Spivak, McClelland, Maier & Neustadt, P.C.

[57] ABSTRACT

A transparent conductive film of a zinc oxide type containing gallium and silicon, which contains silicon in an amount of from 0.01 to 1.5 mol % in terms of $SiO_2$.

2 Claims, 1 Drawing Sheet

TRANSPARENT CONDUCTIVE FILM AND METHOD FOR ITS PRODUCTION, AND SPUTTERING TARGET

BACKGROUND OF THE INVENTION

1. FIELD OF THE INVENTION

The present invention relates to a transparent conductive film and a method for its production, and a sputtering target to be used for producing the transparent conductive film.

2. DISCUSSION OF BACKGROUND

ITO (indium-tin-oxide), which is indium oxide doped with tin, is well known as a transparent and conductive oxide, and an ITO film is widely used as a transparent conductive film for a solar cell and a liquid crystal display.

On the other hand, recently, a zinc oxide-based transparent conductive film has come to be known as a transparent conductive film comparable to an ITO film in transparency and conductivity, and it is expected to become industrially practical in view of cheapness of a zinc oxide-type target as compared with an ITO-type target.

Aluminum is the most common as a dopant for zinc oxide, but it is still impossible to steadily form a film having a low electrical resistance by using aluminum as a dopant, therefore other dopants are under investigation and have been proposed, for example, in Japanese Examined Patent Publication No. 72011/1991.

In film formation methods using a vacuum apparatus such as a sputtering method, before film formation, a film formation chamber which has been left open to the atmospheric air should be previously evacuated to a high vacuum so that the pressure is lower than the pressure during film formation. In such a case, the atmospheric moisture and the moisture which the walls of the chamber adsorbed during the chamber was left open to the atmospheric air (the moisture is desorbed under vacuum) can not be completely removed by means of a vacuum pump, and part of them remain in a vacuum. The amount of the meaning moisture is influenced by factors which are difficult to control such as the atmospheric humidity when the chamber is left open to the atmospheric air, stains on the walls of the film formation chamber and the conditions of the vacuum pump, therefore, it is virtually difficult to control the amount of the remaining moisture to a constant degree. In formation of a transparent conductive film of a zinc oxide type, because zinc oxide is liable to hydrate, and reacts with such remaining moisture, there has been a problem that electrical characteristics of the resulting film varies depending on the amount of the remaining moisture.

Accordingly, a method for producing transparent conductive films of a zinc oxide type having steady characteristics without controlling the remaining moisture in a vacuum has been desired.

In addition, conventional transparent conductive film of a zinc oxide type do not have moisture resistance enough to be used in a humid atmosphere, therefore the improvement in moisture resistance has been desired.

SUMMARY OF THE INVENTION

The object of the present invention is to provide a transparent conductive film of a zinc oxide type which is excellent in moisture resistance.

Another object of the present invention is to provide a sputtering target which enables production of said transparent conductive film of a zinc oxide type.

Still another object of the present invention is to provide a method of producing a transparent conductive film of a zinc oxide type having steady film characteristics during film formation without controlling the remaining moisture in a vacuum.

Namely, according to the first aspect of the present invention, the present invention provides a transparent conductive film of a zinc oxide type containing gallium and silicon, which contains silicon in an amount of from 0.01 to 1.5 mol % in terms of $SiO_2$.

According to the second aspect of the present invention, the present invention provides a sputtering target of an oxide type comprising zinc oxide as the main component, which contains gallium and silicon in an amount of from 0.01 to 1.5 mol % in terms of $SiO_2$.

According to the third aspect of the present invention, the present invention provides a method for producing a transparent conductive film comprising zinc oxide as the main component on a substrate by a sputtering method, wherein a sputtering target comprising zinc oxide as the main component which contains gallium and silicon in an amount of from 0.01 to 1.5 mol % in terms of $SiO_2$, is used.

BRIEF DESCRIPTIONS OF THE DRAWINGS

Figure 1:
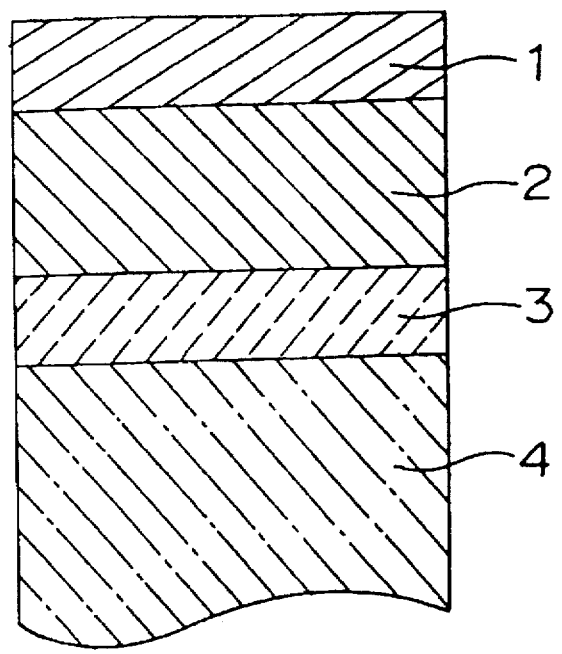
FIG. 1 is a sectional view of a transparent heater element of the present invention.

The present invention provides a transparent conductive film of a zinc oxide type containing gallium and silicon, which contains silicon in an amount of from 0.01 to 1.5 mol % in terms of $SiO_2$.

If the amount of silicon is less than 0.01 mol % in terms of $SiO_2$, the moisture will be more influential, therefore, the specific resistance of the film will changed.

Incorporation of at least 0.01 mol % of silicon in terms of $SiO_2$ lowers the specific resistance. On the other hand, if the amount exceeds 1.5 mol %, the specific resistance of the film increases and tends to change.

The content of gallium in the film is favorably from 0.2 to 8.0 mol % in terms of $Ga_2O_3$. If the content of gallium is less than 0.2 mol % or more than 8.0 mol %, the specific resistance of the film will be high, such being unfavorable. From a practical point of view, the specific resistance of the film is preferably at most $10^{-2}\Omega$ cm.

The method of producing the transparent conductive film of the present invention is not particularly limited, but a sputtering method is preferable.

The present invention also provides a sputtering target of an oxide type comprising zinc oxide as the main component, which contains gallium and silicon in an amount of from 0.01 to 1.5 mol % in terms of $SiO_2$.

If the content of silicon is less than 0.01 mol % in term of $SiO_2$, the characteristics of the film, particularly the specific resistance is susceptible to the remaining moisture in a vacuum during film formation.

If the content exceeds 1.5 mol %, not only the specific resistance of the resulting film is high but also the discharge at the time of sputtering is unstable.

Therefore, it is necessary for the sputtering target of the present invention to contain silicon in an amount of from 0.01 to 1.5 mol % in terms of $SiO_2$.

The content of gallium is preferably from 0.2 to 8.0 mol % in terms of $Ga_2O_3$. If the content is less than 0.2 mol % or more than 8.0 mol %, the specific resistances of the target and the film formed by using the target are high, such being unfavorable. Therefore, it is preferable for the sputtering target of the present invention to contain gallium in an amount of from 0.2 to 8.0 mol % in terms of $Ga_2O_3$.

In the case of direct current sputtering, the specific resistance of a target is preferred to be at most $10^{-2} \Omega$ cm for stable discharge.

Gallium is preferably in an oxidized state or in a solid-solubilized state. The oxidized state means 1) the state of gallium trioxide ($Ga_2O_3$), or 2) the state of a compound oxide of $Ga_2O_3$ with zinc oxide (ZnO) and/or silicon oxide ($SiO_2$).

The solid-solubilized state means the state wherein gallium is solid-solubilized in ZnO and/or $SiO_2$. Most of the gallium is thought to be in the state of a compound oxide $ZnGa_2O_4$ or in the state wherein it is solid-solubilized in ZnO.

Silicon is preferred to be in an oxidized state or in a solid-solubilized state. The oxidized state means 1) the state of $SiO_2$, or 2) the state of a compound oxide of $SiO_2$ with ZnO and/or $Ga_2O_3$.

The solid-solubilized state means the state wherein silicon is solid-solubilized in ZnO and/or $Ga_2O_3$.

Gallium and silicon are present preferably in an oxidized state or a solid-solubilized state, since it is easy to form a transparent film. However, gallium and silicon may be in other states than the oxidized state and the solid solubilized state, such as a state of a metal, a carbide or a nitride, so long as it does not constitute any hindrance.

When the silicon in the sputtering target is in the oxidized state, the maximal size of the crystal grain of the oxide is preferably at most 200 µm. The presence of silicon oxide grains larger than 200 µm is undesirable since it leads to unstable discharge at the time of sputtering.

The target of the present invention may further contain other components to an extent not to impair the purpose and effects of the present invention. However, their amounts should be as small as possible.

The target of the present invention can be obtained by general methods for preparing ceramics such as the hot-pressing method and the pressureless sintering method. The hot-pressing method is preferred since it is possible to obtain a dense target having a low specific resistance.

The target of the present invention is preferred to be obtained by hot-pressing in a vacuum or in an atmosphere of an inert gas under such a temperature condition that the maximal temperature is from 1000° C. to 1200° C. for from 0.5 to 3 hours.

The target of the present invention has a high electrical conductivity, and, therefore, is applicable not only to the direct current sputtering method wherein a film of a large area can be formed and the film forming speed is high but also to any other sputtering method such as the RF sputtering method.

The present invention provides a method of producing a transparent conductive film comprising zinc oxide as the main component on a substrate by a sputtering method, wherein a sputtering target comprising zinc oxide as the main component which contains gallium and silicon in an amount of from 0.01 to 1.5 mol % in terms of $SiO_2$.

As the material of the substrate to be used in the present invention, glass, ceramics, plastics and metals may be mentioned.

In the method of producing a transparent conductive film of the present invention, when the atmospheric gas at the time of sputtering is entirely argon gas, a film which has the lowest specific resistance and is free from optical absorption can be obtained.

Accordingly, as compared with conventional methods wherein an ITO target which requires an appropriate amount of oxygen in addition to argon gas at the time of sputtering, the method of the present invention is advantageous in that there is no need of cumbersome determination of the optimum oxygen concentration in the sputter gas and in that the method can avoid uneven film resistance distribution which is attributable to uneven oxygen concentration.

Sputtering may be carried out, for example, under the following conditions. As the gas to be introduced to constitute the sputtering atmosphere, entire argon gas is preferred, as described above. The pressure is preferably from $1\times10^{-4}$ to $5\times10^{-2}$ Torr for stable discharge. The electrical power input is preferably from 0.1 to 10 W/cm² in terms of electrical power density. Electrical power density means (electrical power input)/(area of a target). An electrical power density smaller than 0.1 W/cm² is problematic in practical use since it leads to a low film forming speed, and is unfavorable since it results in a film with a high specific resistance. On the other hand, if the electrical power density is larger than 10 W/cm², the target will be so overheated as to break. The temperature of the substrate is favorably from room temperature (non-heating) to 400° C. The temperature of the substrate higher than 400° C. is unfavorable since the composition of the film will greatly differ from the composition of the target and the specific resistance of the resulting film will be high.

In the present invention, even if the temperature of the substrate is lower than 200° C., a thermally stable film having a high crystallinity can be obtained, the method of the present invention is advantageous as compared with a method using an ITO target which give a film having a low crystallinity if the temperature of the substrate is lower than 200° C.

The composition of the resulting film is basically almost the same as that of the target, but under some sputtering conditions, the composition of the resulting film can slightly differ from that of the target.

The transparent conductive film of the present invention is suitably used for laminates such as a transparent heater element and a transparent electrode for display panels.

In other words, the transparent conductive film of the present invention can be used in the form of a transparent heater element which has the transparent conductive film of the present invention formed on a substrate (hereinafter referred to as transparent heater element) and in the form of a transparent electrode for display panels having the transparent conductive film of the present invention formed on a substrate (hereinafter referred to as a transparent electrode for display panels).

The film thickness of the transparent conductive film is within a range of from 10 nm to 5 µm, favorably within a range of from 100 nm to 300 nm. If the film thickness exceeds 5 µm, the film forming time will be longer, therefore the cost will increase.

If the film thickness is less than 10 nm, the specific resistance will be high.

In the case of a transparent heater element and a transparent electrode for display panels, by providing an undercoat film between the substrate and the transparent conductive film, and/or an overcoat film on the transparent conductive film, it is possible to adjust the color tone of the transmitted or reflected light or the visible light reflectance or to impart heat-ray reflecting property by virtue of the phenomenon of the interference of light and absorption of light by the film.

An undercoat film or an overcoat film is suitably selected according to additional purposes.

Namely, they are used 1) for the purpose of increasing the mechanical durability of an article coated with the transparent conductive film and improving the handling property, for example, in the case of a transparent electrode for display panels, for the purpose of improving the handling property during the process of assembling a cell.

Further, an undercoat film or an overcoat film is provided for various purpose such as 2) the purpose of imparting chemical stability by preventing the moisture in the atmospheric air or in the substrate or alkaline components of the glass substrate from invading the transparent conductive film during a long period of use and improving the stability of the electrical resistance, 3) the purpose of adjusting the adhesiveness to a resin film in the case that a laminated structure is formed together with another substrate so as to interpose resin film, 4) the purpose of adjusting the adhesiveness to a spacer or other parts used to form a multi-layered structure, or 5) the purpose for imparting heat resistance enough to withstand the processes at a high temperature in the case that the formation of the transparent conductive film is followed by formation of an electrode, or tempering or bending treatment of the glass substrate, or increasing the reliability at a high temperature.

The material of at least one layer of the undercoat film, and/or the material of at least one layer of the overcoat film is favorably an oxide, a nitride or an oxynitride of a metal M, wherein the metal M is at least one metal selected from the group consisting of silicon, tin, titanium, zirconium, hafnium, tantalum, chromium, niobium, boron, zinc and aluminum.

Particularly preferred are a compound oxide, compound nitride or compound oxynitride of zirconium and silicon, and a nitride or oxynitride of silicon, since such are highly effective in improvement of chemical stability.

The overcoat film and the undercoat film are preferred to have a structure having a smooth surface and having substantially no grain boundary that serves as a path for mass transfer, for example, an amorphous structure, in view of mechanical stability and chemical stability. From in this viewpoint, with respect to the proportion of zirconium to silicon, it is preferred that silicon is at least 20 atomic %. If silicon is less than 20 atomic %, the resulting film will be crystalline and an uneven surface and grain boundaries are likely to form.

The thickness of the overcoat film or the undercoat film is favorably from 1 to 100 nm. An overcoat or undercoat film of a thickness less than 1 nm is too thin to function satisfactory. An overcoat or undercoat film of a thickness more than 100 nm takes a long time to be formed and costs a lot due to its high material cost, therefore is not practical.

In the present invention, both the overcoat film and the undercoat film or either of them may be suitably selected. When it is necessary to select one of them, the overcoat film functions more effectively.

In view of heat-ray reflecting property, the material of the overcoat film or the undercoat film is preferably a nitride of titanium, zirconium, chromium, tantalum, niobium or hafnium. In this case, the film thickness is preferably from 1 to 100 nm.

In the case of a transparent heater element, the formation of the transparent conductive film of the present invention may be followed by tempering treatment, or a resin film may be provided on the transparent conductive film.

Further, in the case of a transparent heater element, it is provided with at least two electrode terminals for energization, and a direct voltage, an alternating voltage or a superimposed voltage of a direct voltage and an alternating voltage is applied to the electrode terminals continuously or in a pulse form, so that the transparent heater element evolves Joule's heat. In this case, it is possible to provide a detection means for controlling the temperature or for detecting abnormalities such as abnormal heating or cracking of the transparent heater element.

Figure 2:
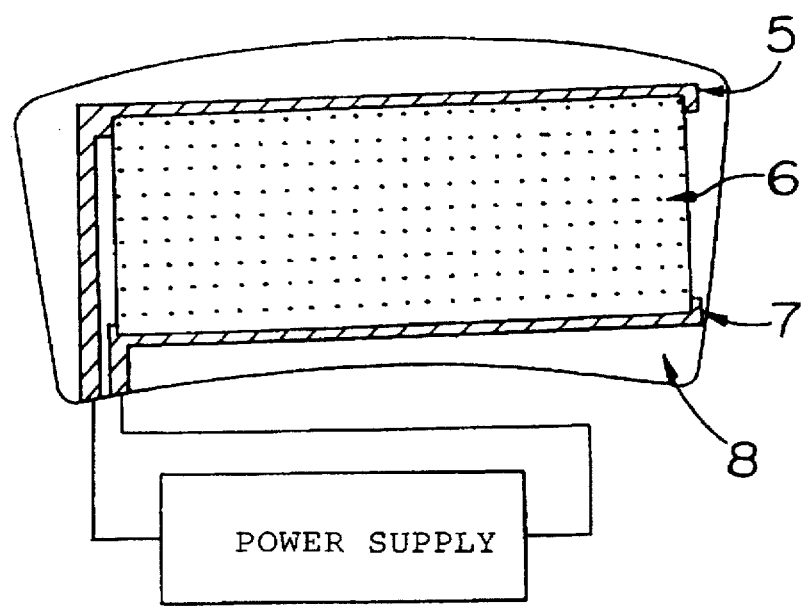
FIG. 2 is a plan view of an electrically heated glass using the transparent conductive film of the present invention.

FIG. 1 is a sectional view of the transparent heater element of the present invention. FIG. 2 is an electrically heated glass using the transparent conductive film of the present invention. In these figures, 1 indicates an overcoat layer, 2 is a transparent conductive film, 3 is an undercoat layer, 4 is a substrate, 5 is an upper bus-bar, 6 is a transparent conductive film, 7 is a lower bus-bar, and 8 is a substrate.

The refractive index of the transparent conductive film of the present invention is from 1.6 to 2.0, which is lower than that of a conventional ITO film (from 2.0 to 2.1), and the difference in refractive index between the transparent conductive film of the present invention and a glass or plastic substrate (refractive index from 1.3 to 1.7) is small. Therefore, the transparent electrode for display panels using the transparent conductive film of the present invention has an advantage that the phenomenon wherein the reflectance at an undisplayed portion is relatively so high due to the difference in refractive index that the electrode pattern at the undisplayed portion where nothing should be seen, is visible enough to make it difficult to read the display panel (hereinafter referred to as pattern visualization), can be obviated.

Here, a display panel means a liquid crystal display device (LCD) or a plasma display panel (PDP) or the like.

In the present invention, silicon oxide firmly binds to the water taken up by the film and makes the water harmless, thereby prevents formation of hydrogen ion (proton) which is an inhibitory factor against electrical conductivity. Further, since silicon oxide allows formation of a dense film therefore reduces the number of absorption sites, incorporation of silicon virtually reduces the effect of the remaining moisture in a vacuum at the time of film formation.

The resulting film contains a small amount of water, namely, it is possible to form a film having an ideal structure which contains little impurities such as hydrogen atom and hydrogen ion which are responsible for structural defects. Therefore, the film itself is structurally resistant to the attack by water molecules, therefore has a high moisture resistance.

Now, the present invention will be described in further detail with reference to Examples. However, it should be understood that the present invention is by no means restricted to such specific Examples.

EXAMPLES 1 to 9

Examples 1 to 9 are Working Examples of the present invention.

ZnO powder (average particle size 1 μm), $Ga_2O_3$ powder (average particle size 1 μm) and $SiO_2$ powder (average particle size 10 μm) were prepared. The ZnO powder, the $Ga_2O_3$ powder and the $SiO_2$ powder mixed by a ball mill in accordance with the compositions of Examples 1 to 9 in Table 1 to obtain nine types of $Ga_2O_3$ —ZnO —$SiO_2$ powder mixtures.

Then, each of the nine types of powder mixtures was stuffed into a carbon mold for hot-pressing and hot-pressed under an argon atmosphere at 1100° C. for 1 hour. The hot-pressing pressure was 100 kg/cm². The maximal size of the silicon oxide crystal grains in each of the resulting nine types of sintered bodies was about 100 µm.

The densities and the specific volume resistance of the nine types of sintered bodies are measured. The specific volume resistances were measured by the four-terminal method. The results are shown in Table 1. Table 1 clearly shows that all the sintered bodies are of a high density and a low resistance.

Nine types of targets of 3 inches in diameter and 5 mm in thickness were prepared by being cut out of the nine types of sintered bodies.

By using each of the nine types of targets, a $Ga_2O_3$—$ZnO$—$SiO_2$ type film was formed by means of a magnetron DC sputtering apparatus under such conditions that the applied power was DC 50 W, the pressure was $5 \times 10^{-3}$ Torr, and the substrate was not heated. As the substrates, soda-lime glass plates were used. The sputtering was conducted so that the film thickness would be about 100 nm.

To examine the influence of the remaining moisture in a vacuum during film formation, for each of the targets, before film formation, evacuation was conducted for different 2 periods. Namely, evacuation was conducted for 30 minutes so that much moisture would still remain, and for 12 hours so that little moisture would remain in a vacuum, to examine the influence of the remaining moisture in a vacuum.

During film formation, the discharge was stable, and there was no trouble. After film formation, the compositions of the films were determined by the ICP method. The film thicknesses and the sheet resistances were measured, and then the specific resistances of the films were calculated from the film thicknesses and the sheet resistances. Table 2 shows the compositions and the specific resistances of the films.

It is clear that when the target of the present invention was used, the specific resistance of the film was independent of the evacuation time, namely, it was possible to form a transparent conductive film having a low resistance irrespective of the moisture in a vacuum.

The moisture resistances of the films were evaluated. The moisture resistance was evaluated in terms of the specific resistance of the film after the film had been left in a thermo-hygrostat at a temperature of 80° C. and a relative humidity of 90% for 500 hours. The results are shown also in Table 2. The films formed by using the target of the present invention did not change their specific resistances, and had a high moisture resistance.

EXAMPLES 10 to 14

Examples 10 to 14 are Comparative Examples.

In the same manner as in Examples 1 to 9, ZnO powder, $Ga_2O_3$ powder and $SiO_2$ powder were prepared, and they were mixed by a ball mill in accordance with the compositions of Examples 10 to 14 in Table 1 to obtain five types, in total, of $Ga_2O_3$—$ZnO$ powder mixtures and $Ga_2O_3$—$ZnO$—$SiO_2$ powder mixtures. Then, five types of sintered bodies were prepared in the same manner as in Examples 1 to 9.

The densities and the specific volume resistances of the resulting sintered bodies were measured. The results are shown in Table 1. The maximal size of the silicon oxide crystal grains in each of the five types of sintered bodies was about 100 µm. Then, targets were prepared in the same manner as in Examples 1 to 9, and films were formed. When the target having the composition of Example 14 was used, a film could barely formed, but the discharge was unstable irrespective of the evacuation time. In the cases of the other targets, discharge was stable.

After film formation, the compositions of the films, the film thicknesses, the sheet resistances and the specific resistances of the films were measured in the same manner as in Examples 1 to 9. The compositions of the films and the specific resistances of the films are shown in Table 2. Table 2 clearly shows that in Comparative Examples, when a film was formed in a vacuum containing little moisture after 12 hours of evacuation, the resulting film shows almost the same performance as a film formed by using the target of the present invention, but when a film was formed in a vacuum containing much moisture after 30 minutes of evacuation, there was an influence of the moisture, and the specific resistances of the films were high.

The moisture resistance of the films thus obtained was evaluated in the same manner as in Examples 1 to 9. The results are shown also in Table 2. Table 2 clearly shows that in Examples 10 to 14, the specific resistances of the films increased.

TABLE 1

| Example | $Ga_2O_3$ (mol %) | $SiO_2$ (mol %) | Density (g/cm³) | Specific resistance ($\times 10^3$ Ωcm) |
| --- | --- | --- | --- | --- |
| 1 | 1.3 | 0.07 | 5.65 | 0.15 |
| 2 | 1.3 | 0.14 | 5.60 | 0.15 |
| 3 | 1.3 | 0.70 | 5.55 | 0.15 |
| 4 | 2.7 | 0.07 | 5.61 | 0.15 |
| 5 | 2.7 | 0.14 | 5.60 | 0.15 |
| 6 | 2.7 | 0.70 | 5.55 | 0.15 |
| 7 | 4.6 | 0.07 | 5.60 | 0.15 |
| 8 | 4.6 | 0.14 | 5.58 | 0.15 |
| 9 | 4.6 | 0.70 | 5.54 | 0.15 |
| 10 | 1.3 | 0 | 5.65 | 0.15 |
| 11 | 2.7 | 0 | 5.61 | 0.15 |
| 12 | 4.6 | 0 | 5.60 | 0.15 |
| 13 | 6.0 | 7 | 4.60 | 2.0 |
| 14 | 6.0 | 14 | 4.30 | 6.0 |

TABLE 2

| | Composition of film | | Specific resistance of film after film formation | Specific resistance of film after moisture resistance test |
| --- | --- | --- | --- | --- |
| Example | Amount of $Ga_2O_3$ (mol %) | Amount of $SiO_2$ (mol %) | ($\times 10^{-3}$ Ωcm) Evacuation time 30 min/12 h | ($\times 10^{-3}$ Ωcm) Evacuation time 30 min/12 h |
| 1 | 1.4 | 0.06 | 3.0/2.8 | 2.9/2.8 |
| 2 | 1.4 | 0.13 | 3.0/2.8 | 2.9/2.8 |
| 3 | 1.4 | 0.67 | 3.0/2.8 | 2.9/2.8 |
| 4 | 2.8 | 0.06 | 1.0/0.9 | 1.0/0.9 |
| 5 | 2.8 | 0.13 | 1.0/0.9 | 1.0/0.9 |
| 6 | 2.8 | 0.67 | 1.0/0.9 | 1.0/0.9 |
| 7 | 4.8 | 0.06 | 1.0/0.9 | 1.0/0.9 |
| 8 | 4.8 | 0.13 | 1.0/0.9 | 1.0/0.9 |
| 9 | 4.8 | 0.67 | 1.0/0.9 | 1.0/0.9 |
| 10 | 1.4 | — | 6.0/3.0 | 15.0/3.8 |
| 11 | 2.8 | — | 4.0/1.0 | 6.0/1.5 |
| 12 | 4.8 | — | 4.0/1.0 | 7.0/1.7 |
| 13 | 2.8 | 6.72 | 9.0/4.0 | 10.0/4.5 |
| 14 | 2.8 | 13.50 | 16.0/7.0 | 18.0/8.0 |

Examples 15 to 17 are examples of application of the transparent conductive film of the present invention to a transparent heater element, and Examples 18 to 20 are examples of application of the transparent conductive film of the present invention to a transparent electrode for display panels.

EXAMPLE 15

A target of the present invention was prepared in the same manner as in Example 5 except that the diameter was 6 inches, and placed in a film formation chamber. Further, a zirconium-silicon alloy target (composition: atomic ratio of Zr/Si=1/2) was placed in the same chamber.

On a glass substrate, a film of a compound nitride of zirconium and silicon ($ZrSi_xN_y$ film) of 3 nm in thickness was formed by using the zirconium-silicon alloy target by reactive sputtering under an argon-nitrogen atmosphere containing 25% of argon and 75% of nitrogen under such conditions that the pressure was $3\times10^{-3}$ Torr, the applied power was 1 kw and the substrate was not heated. Then, by using the target of the present invention, a transparent conductive film of the present invention of 120 nm in thickness was formed by sputtering under an argon atmosphere under such conditions that the pressure was $3\times10^{-3}$ Torr, the applied power was 1 kw and the substrate was not heated, and then a $ZrSi_xN_y$ film of 10 nm in thickness was formed thereon under the same conditions as the above-mentioned $ZrSi_xN_y$ film.

As a result, a $ZrSi_xN_y$ film of 3 nm thick, a transparent conductive film of the present invention of 120 nm thick and a $ZrSi_xN_y$ film of 10 nm thick were formed on the glass substrate in this order without breaking a vacuum.

Electrodes and electrode terminals were printed on it by screen printing technique and baked at 300° C., then lead wires were soldered to the electrode terminals. It was put together with a glass plate of the same size by using a sealant so that a spacer would be interposed therebetween, to obtain an electrically heated glass in the form of a multi-layered glass.

The electrically heated glass thus obtained had such transparency that its visible light transmittance was 83%, and was neutral in respect of color tone. The resistance between the lead wires drawn out through the sealant was measured to find that the resistance between the bus-bar electrodes was 108 Ω. An electrical test was conducted by applying a voltage of 32.2 V between the bus-bar, as a result, neither the resistance nor the appearance changed even after 6 weeks.

EXAMPLE 16

Films were formed on a glass substrate in the same manner as in Example 15 except that instead of the $ZrSi_xN_y$ films in Example 15, films of a compound oxide of zirconium and silicon ($ZrSi_xO_y$ films) were formed by reactive sputtering using a zirconium-silicon alloy target under an argon-oxygen atmosphere containing 70% of argon and 30% of oxygen under such conditions that the pressure was $3\times10^{-3}$ Torr, the applied power was 1 kw and the substrate was not heated.

As a result, a $ZrSi_xO_y$ film of 3 nm thick, a transparent conductive film of the present invention of 120 nm thick and a $ZrSi_xO_y$ film of 10 nm thick were formed on the glass substrate in this order without breaking a vacuum.

By using it, an electrically heated glass was prepared in the same manner as in Example 15. The electrically heated glass thus obtained had such transparency that its visible light transmittance was 84%, and was neutral in respect of color tone. The resistance between the lead wires drawn out through the sealant was measured to find that the resistance between the bus-bar electrodes was 108 Ω. An electrical test was carried out by applying a voltage of 32.2 V across the bus-bars, as a result, neither the resistance nor the appearance changed even after 6 weeks.

EXAMPLE 17

Films were formed on a glass substrate in the same manner as in Example 15 except that instead of $ZrSi_xN_y$ films in Example 15, silicon nitride ($SiN_x$ films) were formed by reactive sputtering using a silicon target under an argon-nitrogen atmosphere containing 25% of argon and 75% of nitrogen under such conditions that the pressure was $3\times10^{-3}$ Torr, the applied power was 1 kw and the substrate was not heated.

As a result, a $SiN_x$ film of 3 nm thick, a transparent conductive film of the present invention of 120 nm thick and a $SiN_x$ film of 10 nm thick were formed on the glass substrate in this order without breaking a vacuum.

By using it, an electrically heated glass was prepared in the same manner as in Example 15. The electrically heated glass thus obtained had such transparency that its visible light transmittance was 83%, and neutral in respect of color tone. The resistance between the lead wires drawn out through the sealant was measured to find that the resistance between the bus-bar electrodes was 108 Ω. An electrical test was carried out by applying a voltage of 32.2 V across the bus-bars, as a result even after 6 weeks, neither the resistance nor the appearance changed.

EXAMPLE 18

A target of the present invention was prepared in the same manner as in Example 5 except that the diameter was 6 inches, and placed in a film formation chamber. By using the target of the present invention, a transparent conductive film of 300 nm in thickness was formed on a PC (polycarbonate) substrate by sputtering under an argon atmosphere and under such conditions that the pressure was $3\times10^{-3}$ Torr, the applied power was 1 kw and the substrate was not heated. The refractive index of the transparent conductive film was 1.7.

After film formation, the film was subjected to patterning by using a weakly acid etching solution to obtain electrodes in a predetermined shape. By using the electrode-mounted PC substrate, a TN type liquid crystal display device was prepared.

The device was examined with the naked eye, as a result no pattern visualization was observed.

EXAMPLE 19

An electrode-mounted PC substrate was prepared in the same manner as in Example 18 except that before formation of the transparent conductive film of the present invention, a $ZrSi_xN_y$ film of 10 nm in thickness was formed by reactive sputtering using a zirconium-silicon alloy target under an argon-nitrogen atmosphere containing 25% of argon and 75% of nitrogen and under such conditions that the pressure was $3\times10^{-3}$ Torr, the applied power was 1 kw and the substrate was not heated.

As a result, a $ZrSi_xN_y$ film of 10 nm thick and a transparent conductive film of the present invention of 300 nm thick were formed on the PC substrate in this order without breaking a vacuum. The refractive index of the transparent conductive film was 1.7.

By using the electrode-mounted PC substrate, a TN type liquid crystal display device was prepared in the same manner as in Example 18. The device thus obtained was examined by the naked eye, as a result no pattern visualization was not observed. Further, the device was incubated in a thermo-hygrostat maintained at a temperature of 80° C. and a relative humidity of 90% for 500 hours to examine the change in capacitive frequency characteristics, namely, dielectric constant $\epsilon'$, at 1 kHz during the incubation. As a result, the dielectric constant $\epsilon'$ was 6.5 before the incubation in the thermo-hygrostat, and 7.0 after 500 hours of incubation, thus there was little change in dielectric constant.

EXAMPLE 20

Films were formed on a PC substrate in the same manner as in Example 19 except that instead of the $ZrSi_xN_y$ film in Example 19, a $SiN_x$ film was formed by reactive sputtering using a silicon target under an argon-nitrogen atmosphere containing 25% of argon and 75% of nitrogen and under such conditions that the pressure was $3\times10^{-3}$ Torr, the applied power was 1 kw and the substrate was not heated.

As a result, a $SiN_x$ film of 10 nm thick and a transparent conductive film of the present invention of 300 nm thick were formed on the PC substrate in this order without breaking a vacuum. The refractive index of the transparent conductive film was 1.7. By using the electrode-mounted PC substrate, a TN type liquid crystal display device was prepared in the same manner as in Example 18. The device thus obtained was examined by the naked eye, as a result no pattern visualization was observed. Further, the device was incubated in a thermo-hygrostat maintained at a temperature of 80° C. and a relative humidity of 90% for 500 hours to examine the change in capacitive frequency characteristics, namely, dielectric constant $\epsilon'$ at 1 kHz during the incubation. As a result, the dielectric constant $\epsilon'$ was 6.5 before the incubation in the thermo-hygrostat, and 7.0 after 500 hours of incubation, thus there was little change in dielectric constant.

The target of the present invention allows to form a transparent conductive film of a zinc oxide type which has stable film properties during film formation without controlling the remaining water in a vacuum. The transparent conductive film of the present invention has an excellent moisture resistance.

The transparent heater element of the present invention is excellent in reliability during a long period of energization and stability to environmental attacks, as compared with a transparent heater element using a thin film of a metal such as silver.

Since the transparent conductive film of the present invention can be formed by a direct current sputtering method which not only allows formation of a homogeneous film having an uniform film thickness on a substrate of a large area, but also allows formation of a plurality of films on a plurality of small substrates at the same time, it is applicable to anti-fogging of a front windshield of an automobile which requires a film of large area, for example, of at least 1 m wide, and is excellent also in production efficiency.

Further, the transparent conductive film of the present invention is provided with various desired properties such as high moisture resistance, high transparency, low electrical resistance, high heat resistance in the atmosphere and low costs, therefore it is suitable for 1) a transparent heater element of an electrically heated glass for anti-fogging or anti-icing of windshields of automobiles and refrigerated showcases, 2) a transparent electrode of a display panel such as a liquid crystal display panel or a plasma display panel, 3) a transparent electrode for solar cells and light receptors, 4) a heat ray reflecting film, selective permeation film and an electromagnetic wave-shielding film for buildings and automobiles, and 5) an antistatic film for photomasks or buildings.

What is claimed is:

1. A transparent conductive film, comprising zinc oxide containing gallium and silicon, said silicon in an amount of from 0.01 to 1.5 mol % in terms of $SiO_2$, and said gallium in an amount of from 0.2 to 8.0 mol % in terms of $Ga_2O_3$.

2. The conductive film of claim 1, wherein said transparent conductive film has a specific resistance of at most $10^{-2}\Omega$ cm.

* * * * *